(12) United States Patent
Saga

(10) Patent No.: US 8,980,984 B2
(45) Date of Patent: *Mar. 17, 2015

(54) THERMALLY CONDUCTIVE POLYMER COMPOSITIONS AND ARTICLES MADE THEREFROM

(75) Inventor: Yuji Saga, Tochigi (JP)

(73) Assignee: Ticona LLC, Florence, KY (US)

( * ) Notice: Subject to any disclaimer, the term of this patent is extended or adjusted under 35 U.S.C. 154(b) by 180 days.

This patent is subject to a terminal disclaimer.

(21) Appl. No.: 13/383,468

(22) PCT Filed: Jul. 21, 2010

(86) PCT No.: PCT/IB2010/053332
§ 371 (c)(1),
(2), (4) Date: Oct. 12, 2012

(87) PCT Pub. No.: WO2011/010291
PCT Pub. Date: Jan. 27, 2011

(65) Prior Publication Data
US 2013/0062556 A1    Mar. 14, 2013

Related U.S. Application Data

(60) Provisional application No. 61/228,171, filed on Jul. 24, 2009.

(51) Int. Cl.
| | | |
|---|---|---|
| C08K 3/22 | (2006.01) | |
| C08K 3/00 | (2006.01) | |
| C08K 7/04 | (2006.01) | |
| C09K 19/02 | (2006.01) | |
| C09K 19/38 | (2006.01) | |
| C09K 19/52 | (2006.01) | |
| H05K 7/20 | (2006.01) | |

(52) U.S. Cl.
CPC ............... *C08K 3/0008* (2013.01); *C08K 7/04* (2013.01); *C09K 19/02* (2013.01); *C09K 19/3809* (2013.01); *C09K 19/52* (2013.01); *H05K 7/20481* (2013.01)
USPC .......................... 524/433; 523/200; 523/212

(58) Field of Classification Search
USPC .................................... 524/433; 523/200, 212
See application file for complete search history.

(56) References Cited

U.S. PATENT DOCUMENTS

| | | |
|---|---|---|
| 3,315,308 A | 4/1967 | Wiley et al. |
| 3,777,099 A | 12/1973 | Levinson |
| 4,118,372 A | 10/1978 | Schaefgen |
| 4,174,358 A | 11/1979 | Epstein |
| 4,265,968 A | 5/1981 | Prewo |
| 4,266,108 A | 5/1981 | Anderon et al. |
| 4,357,271 A * | 11/1982 | Rosenquist .................. 523/212 |
| 4,362,917 A | 12/1982 | Freedmand et al. |
| 4,425,368 A | 1/1984 | Watkins |
| 4,454,403 A | 6/1984 | Teich et al. |
| 4,503,168 A | 3/1985 | Hartsing, Jr. |
| 4,518,651 A | 5/1985 | Wolfe, Jr. |
| 4,541,411 A | 9/1985 | Woolf |
| 4,542,271 A | 9/1985 | Tanonis et al. |
| 4,563,488 A | 1/1986 | Minami et al. |
| 4,585,823 A | 4/1986 | Saito et al. |
| 4,626,557 A | 12/1986 | Duska et al. |
| 4,649,448 A | 3/1987 | Nakajima |
| 4,714,734 A | 12/1987 | Hashimoto et al. |
| 4,728,762 A | 3/1988 | Roth et al. |
| 4,851,632 A | 7/1989 | Kaliski |
| 4,922,811 A | 5/1990 | Stumpf |
| 4,933,526 A | 6/1990 | Fisher et al. |
| 4,959,516 A | 9/1990 | Tighe et al. |
| 5,021,293 A | 6/1991 | Huang et al. |
| 5,028,461 A | 7/1991 | Nakamichi |
| 5,049,714 A | 9/1991 | Beresniewicz et al. |
| 5,057,659 A | 10/1991 | Schneider et al. |
| 5,130,342 A | 7/1992 | McAlister et al. |
| 5,141,985 A | 8/1992 | Asai et al. |
| 5,183,643 A | 2/1993 | Nichols |
| 5,229,563 A | 7/1993 | Isogai et al. |
| 5,268,546 A | 12/1993 | Berg |
| 5,308,913 A | 5/1994 | Asai et al. |
| 5,428,100 A | 6/1995 | Asai et al. |
| 5,486,683 A | 1/1996 | Shimizu et al. |
| 5,529,716 A | 6/1996 | Nomura et al. |
| 5,665,819 A | 9/1997 | Tenzer |
| 5,677,253 A | 10/1997 | Inoue et al. |
| 5,976,406 A | 11/1999 | Nagano et al. |
| 6,077,454 A | 6/2000 | Tenzer |
| 6,146,764 A | 11/2000 | Suokas et al. |
| 6,326,599 B1 | 12/2001 | Pickford |
| 6,346,568 B1 | 2/2002 | Maeda et al. |

(Continued)

FOREIGN PATENT DOCUMENTS

| | | |
|---|---|---|
| EP | 0 478 082 A1 | 4/1992 |
| EP | 0 494 422 A2 | 7/1992 |
| EP | 0 494 422 A3 | 7/1992 |
| EP | 0 846 419 A1 | 6/1998 |
| JP | 2009007552 A * | 1/2009 |
| WO | WO 9405728 A1 | 3/1994 |
| WO | WO 0134702 A2 | 5/2001 |
| WO | WO 0134702 A3 | 5/2001 |
| WO | WO 2004011539 A2 | 2/2004 |
| WO | WO 2004011539 A3 | 2/2004 |
| WO | WO 2006057458 A1 | 6/2006 |
| WO | WO 2011010290 A1 | 1/2011 |

OTHER PUBLICATIONS

Abstract of Japanese Patent No. JPS61181847, Aug. 14, 1986—Thermally Conductive Resin Composition and Thermally Conductive Molding.

(Continued)

*Primary Examiner* — Vickey Nerangis
(74) *Attorney, Agent, or Firm* — Dority & Manning, P.A.

(57) ABSTRACT

Thermally conductive polymer compositions comprising polymer, highly moisture resistant magnesium oxide, and filler having higher aspect ratio than 5. The compositions are particularly useful for metal/polymer hybrid parts.

10 Claims, No Drawings

(56) References Cited

U.S. PATENT DOCUMENTS

| | | | |
|---|---|---|---|
| 6,487,073 | B2 | 11/2002 | McCullough et al. |
| 6,495,616 | B2 | 12/2002 | Maeda |
| 6,641,878 | B2 | 11/2003 | Suzuki et al. |
| 6,702,956 | B2 | 3/2004 | Maeda et al. |
| 6,758,989 | B2 | 7/2004 | Miyashita et al. |
| 6,815,486 | B2 | 11/2004 | Bhagwagar et al. |
| 6,830,769 | B2 | 12/2004 | Meroni |
| 6,871,351 | B2 | 3/2005 | Yamauchi et al. |
| 6,919,111 | B2 | 7/2005 | Swoboda et al. |
| 6,939,477 | B2 | 9/2005 | Stark et al. |
| 6,989,194 | B2 | 1/2006 | Bansal et al. |
| 7,790,786 | B2 | 9/2010 | Murouchi et al. |
| 8,097,481 | B2 | 1/2012 | Imer et al. |
| 8,119,176 | B2 | 2/2012 | Moons |
| 8,269,154 | B2 | 9/2012 | Samuels et al. |
| 8,491,813 | B2 | 7/2013 | Moons |
| 2005/0176835 | A1* | 8/2005 | Kobayashi et al. ............ 521/56 |
| 2006/0014876 | A1 | 1/2006 | Bushelman et al. |
| 2006/0237451 | A1 | 10/2006 | Samuels et al. |
| 2009/0162538 | A1* | 6/2009 | Boehm et al. ................ 427/116 |
| 2013/0003416 | A1 | 1/2013 | Saga |

OTHER PUBLICATIONS

Abstract of Japanese Patent No. JPH0967446, Mar. 11, 1997, 2 pages—Continuous Production of Molecular Composite Material Comprising Liquid Crystalline Polymer and Thermoplastic Polymer.
Abstract of Japanese Patent No. 2006282783, Oct. 19, 2006, 1 page—Highly Heat-Conductive Resin Composition.
Abstract and Machine Translation of JP2008133382, Jun. 12, 2008, 10 pages—Heat-Conductive Resin Composition.
Abstract and Machine Translation of JP2009007552, Jan. 15, 2009, 15 pages—Therm0plastic Resin Composition for Light-Emitting Element, Molding Made Therefrom, and Light-Emitting Element Using the Same.
Abstract of WO013720, May 17, 2001, 1 page.
Abstracct of WO 2005033216, Apr. 14, 2005, 1 page.
Abstract of WO2008066051, Jun. 5, 2008, 1 page.
Article—Olofa et al., Thermal Conductivity of the Ferrites $Ni_{0.65}Zn_{0.35}Cu_xFe_{2-x}O_4$, *Journal of Thermal Analysis*, vol. 37, 1991, pp. 2277-2284.
Article—Touloukian, et al., "Thermal Conductivity Nonmetallic Solids," *Thermophysical Properties of Matter*, vol. 2, Dec. 1970, pp. 295-300.
Chapter 3: Japan's Near-Term Optical Storage Roadmap, Feb. 1996, 8 pages.
Nippon Steel Technical Report No. 84, Jul. 2001, "Pitch-Based Carbon Fiber with Low Modulus and High Heat Conduction".
Abstract and Machine Translation of JP2001-115057 dated Apr. 24, 2001, 14 pages.
Abstract of JP2003-034523, Feb. 7, 2003, 1 page.
Abstract and Machine Translation of JP2004-175812 dated Jun. 24, 2004, 53 pages.
Abstract and Machine Translation of JP2006-282783 dated Oct. 19, 2006, 17 pages.
Abstract of JP2008-184540, Aug. 14, 2008, 1 page.
Abstract of WO2007/135749, Nov. 29, 2007, 1 page.

* cited by examiner

THERMALLY CONDUCTIVE POLYMER COMPOSITIONS AND ARTICLES MADE THEREFROM

CROSS REFERENCE TO RELATED APPLICATION

This application is the national stage entry of International Patent Application No. PCT/IB2010/05332 having a filing date of Jul. 21, 2010, which claims filing benefit of U.S. Provisional Application Ser. No. 61/228,171 having a filing date of Jul. 24, 2009, which are incorporated herein by reference in their entirety.

FIELD OF THE INVENTION

Thermally conductive polymer compositions comprising polymer and combination of water resistant magnesium oxide with fillers having high aspect ratio are useful as components for electric and electronics devices which require thermal management.

BACKGROUND OF THE INVENTION

Because of their excellent mechanical and electrical insulation properties, polymeric resin compositions are used in a broad range of applications such as in automotive parts, electrical and electronic parts, machine parts and the like. In many cases, because of the design flexibility they permit, sealing capability and their electrical insulation properties, polymer resin compositions can be used as encapsulants, housings and frames for electrical and electronics devices or motors. However, not only are electrical insulation properties needed in the encapsulating polymer compositions, but they also often need to have higher thermal conductivities especially with the downsizing trend of some electrical devices. Another important requirement for encapsulating polymer compositions is that their Coefficients of Linear Thermal Expansions (CLTEs) should be close to CLTEs of materials encapsulated with the polymer compositions to retain seal integrity while releasing heat generated by the encapsulated devices. In general, higher loading with thermally conductive filler in polymer leads to higher thermal conductivity and lower CLTE because the fillers' CLTEs are often lower than polymers' CLTEs. However, high filler loadings often decreases flowability of polymer compositions in melt forming processes, and that can lead to failure of sealing performance or damage of core devices encapsulated with the polymer compositions. Another important requirement for housings or frames is mechanical strength. Thus, polymer composition having higher thermal conductivity, electrically insulation, lower CLTE, higher mechanical strength and good flowability is desired.

Japanese patent application publication 2006-282783 discloses a polymer composition comprising polyarylene sulfide and fibrous filler and a moisture resistant magnesium oxide. However the composition's moisture resistance under high temperature and high pressure is not enough to be used under sever environment.

Japanese laid-open patent JP2008-1333382 discloses a polymer composition comprising liquid crystalline polymer and titanium oxide fiber and a moisture resistant magnesium oxide. However the composition's moisture resistance under high temperature and high pressure is not enough to be used under sever environment.

SUMMARY OF THE INVENTION

There is disclosed and claimed herein a thermally conductive polymer composition, comprising:

(a) about 15 to about 70 weight percent of thermoplastic polymer
(b) about 20 to about 60 weight percent of magnesium oxide and
(c) about 5 to about 50 weight percent of filler having an aspect ratio greater than 5.

wherein said (b) magnesium oxide has a weight gain by conditioning at 90° C., 90% RH for 100 hours of less than 1% and, wherein said polymer composition has a thermal conductivity of at least 0.5 W/mK the percentages being based on the total weight of the composition.

DETAILED DESCRIPTION OF THE INVENTION

The composition of the present invention comprises (a) at least one thermoplastic polymer, (b) highly moisture resistant magnesium oxide, (c) filler having higher aspect ratio than 5.

(a) The thermoplastic polymer is the polymer matrix of the composition, and in which one or more polymers are used in a continuous phase. Useful thermoplastic polymers include polycarbonates, polyolefins such as polyethylene and polypropylene, polyacetals, acrylics, vinyls, fluoropolymers, polyamides, polyesters, polysulfones, polyarylene sulfides, liquid crystal polymers such as aromatic polyesters, polyetherimides, polyamideimides, polyacetals, polyphenylene oxides, polyarylates, polyetheretherketones (PEEK), polyetherketoneketones (PEKK), and syndiotactic polystyrenes, and blends thereof.

Preferred polymers of this invention are polyesters, polyamides, polyarylene sulfides and liquid crystal polymers (LCPs).

More preferred thermoplastic polyesters of this invention include polyesters having an inherent viscosity of 0.3 or greater and that are, in general, linear saturated condensation products of diols and dicarboxylic acids, or reactive derivatives thereof. Preferably, they will comprise condensation products of aromatic dicarboxylic acids having 8 to 14 carbon atoms and at least one diol selected from the group consisting of neopentyl glycol, cyclohexanedimethanol, 2,2-dimethyl-1,3-propane diol and aliphatic glycols of the formula $HO(CH_2)_nOH$ where n is an integer of 2 to 10. Up to 20 mole percent of the diol may be an aromatic diol such as ethoxylated bisphenol A, sold under the tradename Dianol® 220 by Akzo Nobel Chemicals, Inc.; hydroquinone; biphenol; or bisphenol A. Up to 50 mole percent of the aromatic dicarboxylic acids can be replaced by at least one different aromatic dicarboxylic acid having from 8 to 14 carbon atoms, and/or up to 20 mole percent can be replaced by an aliphatic dicarboxylic acid having from 2 to 12 carbon atoms. Copolymers may be prepared from two or more diols or reactive equivalents thereof and at least one dicarboxylic acid or reactive equivalent thereof or two or more dicarboxylic acids or reactive equivalents thereof and at least one diol or reactive equivalent thereof. Difunctional hydroxy acid monomers such as hydroxybenzoic acid or hydroxynaphthoic acid or their reactive equivalents may also be used as comonomers.

Preferred polyesters include poly(ethylene terephthalate) (PET), poly(1,4-butylene terephthalate) (PBT), poly(1,3-propylene terephthalate) (PPT), poly(1,4-butylene 2,6-naphthalate) (PBN), poly(ethylene 2,6-naphthalate) (PEN), poly (1,4-cyclohexylene dimethylene terephthalate) (PCT), and copolymers and mixtures of the foregoing. Also preferred are 1,4-cyclohexylene dimethylene terephthalate/isophthalate copolymer and other linear homopolymer esters derived from aromatic dicarboxylic acids, including isophthalic acid; bibenzoic acid; naphthalenedicarboxylic acids including the 1,5-; 2,6-; and 2,7-naphthalenedicarboxylic acids; 4,4'-diphenylenedicarboxylic acid; bis(p-carboxyphenyl) methane; ethylene-bis-p-benzoic acid; 1,4-tetramethylene bis(p-oxybenzoic) acid; ethylene bis(p-oxybenzoic) acid; 1,3-trimethylene bis(p-oxybenzoic) acid; and 1,4-tetramethylene bis(p-oxybenzoic) acid, and glycols selected from the group consisting of 2,2-dimethyl-1,3-propane diol; neopentyl glycol; cyclohexane dimethanol; and aliphatic glycols of the general formula $HO(CH_2)_nOH$ where n is an integer from 2 to 10, e.g., ethylene glycol; 1,3-trimethylene glycol; 1,4-tetramethylene glycol; -1,6-hexamethylene glycol; 1,8-octamethylene glycol; 1,10-decamethylene glycol; 1,3-propylene glycol; and 1,4-butylene glycol. Up to 20 mole percent, as indicated above, of one or more aliphatic acids, including adipic, sebacic, azelaic, dodecanedioic acid or 1,4-cyclohexanedicarboxylic acid can be present. Also preferred are copolymers derived from 1,4-butanediol, ethoxylated bisphenol A, and terephthalic acid or reactive equivalents thereof. Also preferred are random copolymers of at least two of PET, PBT, and PPT, and mixtures of at least two of PET, PBT, and PPT, and mixtures of any of the forgoing.

The thermoplastic polyester may also be in the form of copolymers that contain poly(alkylene oxide) soft segments (blocks). The poly(alkylene oxide) segments are present in about 1 to about 15 parts by weight per 100 parts per weight of thermoplastic polyester. The poly(alkylene oxide) segments have a number average molecular weight in the range of about 200 to about 3,250 or, preferably, in the range of about 600 to about 1,500. Preferred copolymers contain poly(ethylene oxide) and/or poly(tetramethylenether glycol) incorporated into a PET or PBT chain. Methods of incorporation are known to those skilled in the art and can include using the poly(alkylene oxide) soft segment as a comonomer during the polymerization reaction to form the polyester. PET may be blended with copolymers of PBT and at least one poly(alkylene oxide). A poly(alkylene oxide) may also be blended with a PET/PBT copolymer. The inclusion of a poly(alkylene oxide) soft segment into the polyester portion of the composition may accelerate the rate of crystallization of the polyester.

Preferred polyamides include semi-crystalline polyamide and amorphous polyamide.

The semi-crystalline polyamide includes aliphatic or semi-aromatic semi-crystalline polyamides.

The semi-crystalline aliphatic polyamide may be derived from aliphatic and/or alicyclic monomers such as one or more of adipic acid, sebacic acid, azelaic acid, dodecanedoic acid, or their derivatives and the like, aliphatic $C_6$-$C_{20}$ alkylenediamines, alicyclic diamines, lactams, and amino acids. Preferred diamines include bis(p-aminocyclohexyl)methane; hexamethylenediamine; 2-methylpentamethylenediamine; 2-methyloctamethylenediamine; trimethylhexamethylenediamine; 1,8-diaminooctane; 1,9-diaminononane; 1,10-diaminodecane; 1,12-diaminododecane; and m-xylylenediamine. Preferred lactams or amino acids include 11-aminododecanoic acid, caprolactam, and laurolactam.

Preferred aliphatic polyamides include polyamide 6; polyamide 6,6; polyamide 4,6; polyamide 6,10; polyamide 6,12; polyamide 11; polyamide 12; polyamide 9,10; polyamide 9,12; polyamide 9,13; polyamide 9,14; polyamide 9,15; polyamide 6,16; polyamide 9,36; polyamide 10,10; polyamide 10,12; polyamide 10,13; polyamide 10,14; polyamide 12,10; polyamide 12,12; polyamide 12,13; polyamide 12,14; polyamide 6,14; polyamide 6,13; polyamide 6,15; polyamide 6,16; and polyamide 6,13.

The semi-aromatic semi-crystalline polyamides are one or more homopolymers, copolymers, terpolymers, or higher polymers that are derived from monomers containing aromatic groups. Examples of monomers containing aromatic groups are terephthalic acid and its derivatives. It is preferred that about 5 to about 75 mole percent of the monomers used to make the aromatic polyamide used in the present invention contain aromatic groups, and it is still more preferred that about 10 to about 55 mole percent of the monomers contain aromatic groups.

Examples of preferred semi-crystalline semi-aromatic polyamides include poly(m-xylylene adipamide) (polyamide MXD,6), poly(dodecamethylene terephthalamide) (polyamide 12,T), poly(decamethylene terephthalamide) (polyamide 10,T), poly(nonamethylene terephthalamide) (polyamide 9,T), hexamethylene adipamide/hexamethylene terephthalamide copolyamide (polyamide 6,T/6,6), hexamethylene terephthalamide/2-methylpentamethylene terephthalamide copolyamide (polyamide 6,T/D,T); hexamethylene adipamide/hexamethylene terephthalamide/ hexamethylene isophthalamide copolyamide (polyamide 6,6/6,T/6,I); poly(caprolactam-hexamethylene terephthalamide) (polyamide 6/6,T); and the like.

In the present invention, a semi-crystalline semi-aromatic polyamide is preferred in terms of heat resistance, dimension stability and moisture resistance at high temperature Semi-crystalline semi-aromatic polyamides derived from monomers containing aromatic groups are especially advantageous for uses in applications that require a balance of properties (e.g., mechanical performance, moisture resistance, heat resistance, etc.) in the polyamide composition as well as higher thermal conductivity.

In the present invention, amorphous polyamides can be used in the polymer composition without giving significant negative influence on the properties. They are one or more homopolymers, copolymers, terpolymers, or higher polymers that are derived from monomers containing isophthalic acid and/or dimethyldiaminodicyclohexylmethane groups.

In the preferred amorphous polyamide, the polyamide consists of a polymer or copolymer having repeating units derived from a carboxylic acid component and an aliphatic diamine component. The carboxylic acid component is isophthalic acid or a mixture of isophthalic acid and one or more other carboxylic acids wherein the carboxylic acid component contains at least 55 mole percent, based on the carboxylic acid component, of isophthalic acid. Other carboxylic acids that may be used in the carboxylic acid component include terephthalic acid and adipic acid. The aliphatic diamine component is hexamethylene diamine or a mixture of hexamethylene diamine and 2-methyl pentamethylene diamine and/or 2-ethyltetramethylene diamine, in which the aliphatic diamine component contains at least 40 mole percent, based on the aliphatic diamine component, of hexamethylene diamine.

Examples of preferred amorphous polyamides include poly(hexamethylene terephthalamide/hexamethylene isophthalamide) (polyamide 6,T/6,I), poly(hexamethylene isophthalamide) (polyamide 6,I), poly(metaxylylene isophthalamide/hexamethylene isophthalamide) (polyamide MXD,I/6,I), poly(metaxylylene isophthalamide/metaxylylene terephthalamide/hexamethylene isophthalamide) (polyamide MXD,I/MXD,T/6,I/6,T), poly(metaxylylene isophthalamide/dodecamethylene isophthalamide) (polyamide MXD,I/12,I), poly(metaxylylene isophthalamide) (polyamide MXD,I), poly(dimethyldiaminodicyclohexylmethane isophthalamide/dodecanamide) (polyamide MACM,I/12), poly(dimethyldiaminodicyclohexylmethane isophthalamide/dimethyldiaminodicyclohexylmethane terephthalamide/dodecanamide) (polyamide MACM,I/MACM,T/12), poly(hexamethylene isophthalamide/ dimethyldiaminodicyclohexylmethane isophthalamide/dodecanamide) (polyamide 6,I/MACM,I/12), poly(hexamethylene isophthalamide/hexamethylene terephthalamide/dimethyldiaminodicyclohexylmethane isophthalamid/dimethyldiaminodicyclohexylmethane terephthalamide) (polyamide 6,I/6,T/MACM,I/MACM,T), poly(hexamethylene isophthalamide/hexamethylene terephthalamide/dimethyldiaminodicyclohexylmethane isophthalamid/dimethyldiaminodicyclohexylmethane terephthalamide/dodecanamide) (polyamide 6,I/6,T/MACM,I/MACM,T/12), poly(dimethyldiaminodicyclohexylmethane isophthalamide/dimethyldiaminodicyclohexylmethane dodecanamide) (polyamide MACM,I/MACM,12) and mixtures thereof.

When an amorphous polyamide is used, the semicrystalline polyamide is present in about 40 to about 100 (and preferably about 70 to about 100) weight percent, based on the total amount of semicrystalline and amorphous polyamide present.

Preferred polyarylene sulfide includes any polyarylene sulfides so far as those belong to the category called a polyarylene sulfide.

The polyarylene sulfide may be a straight-chain compound, a compound having been subjected to treatment at high temperature in the presence of oxygen to crosslink, a compound having some amount of a crosslinked or branched structure introduced therein by adding a small amount of a trihalo or more polyhalo compound, a compound having been subjected to heat treatment in a non-oxidizing inert gas such as nitrogen, or a mixture of those structures.

By a LCP is meant a polymer that is anisotropic when tested using the TOT test or any reasonable variation thereof, as described in U.S. Pat. No. 4,118,372, which is hereby incorporated by reference. Useful LCPs include polyesters, poly(ester-amides), and poly(ester-imides). One preferred form of LCP is "all aromatic", that is all of the groups in the polymer main chain are aromatic (except for the linking groups such as ester groups), but side groups which are not aromatic may be present.

The thermoplastic polymer (a) will preferably be present in about 15 to about 70 weight percent, or more preferably about 20 to about 50 weight percent, based on the total weight of the composition.

Moisture resistance at high temperature of magnesium oxide can be estimated by its weight gain in conditioning at 90° C., 90% RH for 100 hours. The weight gain of the magnesium oxide (b) used in present invention is less than 1%, and more preferably 0.8%. If the weight gain is more than 1%, good PCT resistance is difficult to obtain.

The shape of magnesium oxide (b) is usually spherical or granular or irregular, and its aspect ratio is lower than 5. If the aspect ratio is larger than 5, isotropically-high thermal conductivity can not be gained in articles molded of the resin composition. The particles or granules can have a broad particle size distribution. Preferably, maximum particle size is less than 300 μm, and more preferably less than 200 μm. Preferably, BET surface area is less than 3 square meters per gram, and more preferably less than 2 for the reason that large surface area leads to deterioration of moisture resistance of the polymer composition. The particles which have multi-modal size distribution in their particle size can also be used.

The surface of the magnesium oxide (b) can be processed with a coupling agent, for the purpose of improving the interfacial bonding between the magnesium oxide surface and the matrix polymer. Examples of the coupling agent include silane series, titanate series, zirconate series, aluminate series, and zircoaluminate series coupling agents.

Useful coupling agents include metal hydroxides and alkoxides including those of Group IIIa thru VIIIa, Ib, IIb, IIIb, and IVb of the Periodic Table and the lanthanides. Specific coupling agents are metal hydroxides and alkoxides of metals selected from the group consisting of Ti, Zr, Mn, Fe, Co, Ni, Cu, Zn, Al, and B. Preferred metal hydroxides and alkoxides are those of Ti and Zr. Specific metal alkoxide coupling agents are titanate and zirconate orthoesters and chelates including compounds of the formula (I), (II) and (III):

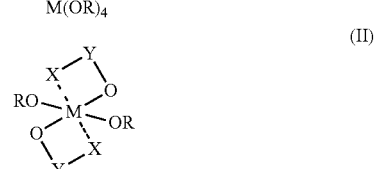

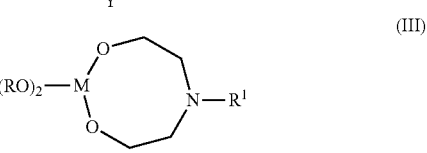

wherein
M is Ti or Zr;
R is a monovalent $C_1$-$C_8$ linear or branched alkyl;
Y is a divalent radical selected from —CH(CH$_3$)—, —C(CH$_3$)=CH$_2$—, or —CH$_2$CH$_2$—;
X is selected from OH, —N(R$^1$)$_2$, —C(O)OR$^3$, —C(O)R$^3$, —CO$_2^-$A$^+$; wherein
R$^1$ is a —CH$_3$ or C$_2$-C$_4$ linear or branched alkyl, optionally substituted with a hydroxyl or interrupted with an ether oxygen; provided that no more than one heteroatom is bonded to any one carbon atom;
R$^3$ is C$_1$-C$_4$ linear or branched alkyl;
A$^+$ is selected from NH$_4^+$, Li$^+$, Na$^+$, or K$^+$.

The coupling agent can be added to the filler before mixing the filler with the resin, or can be added while blending the filler with the resin. The additive amount of coupling agent is preferably 0.1 through 5 wt % or more preferably 0.5 through 2 wt % with respect to the weight of the filler. Addition of coupling agent during the blending of the magnesium oxide with the resin has the added advantage of improving the adhesiveness between the metal used in the joint surface between the heat transfer unit or heat radiating unit and the thermally conductive resin.

The magnesium oxide (b) will preferably be present in 20 to 60 weight percent, more preferably 35 to 55 weight percent, based on the total weight of the composition.

The filler having higher aspect ratio than 5 used as component (c) in the present invention includes glass fibers, wallastonites, glass flakes, talc, mica, boron nitride, titanium oxide fiber, alumina fibers, boron fibers, potassium titanate whiskers, aluminum borate whiskers and zinc oxide whiskers.

Preferably, glass fibers, wallastonites, alumina fibers, boron fibers, zinc oxide whiskers are selected as component (c), and more preferably, glass fibers are used as component (c).

In the similar way processed on the surface of the magnesium oxide (b), the surface of the filler (c) can be processed with a coupling agent, for the purpose of improving the interfacial bonding between the magnesium oxide surface and the matrix polymer.

Component (c) will be present in 5 to 50 weight percent, or preferably 10 to 40 weight percent, or more preferably 20 to 40 weight percent, based on the total volume of the composition. If its content is less than 5 weight percent, enough mechanical strength and low CLTE can't be obtained. If its content is more than 40 weight percent, flow-ability of the resin composition gets worse.

Preferably, the weight ratio of (b)/(c) is preferably between 28/72 and 92/8, or more preferably between 40/60 and 85/15. If the ratio is less than 28/72, thermal conductivity of the composition will become low, and if the ratio is more than 92/8, heat shock resistance of the composition will be deteriorated.

The polymeric toughening agent optionally used in the present invention is any toughening agent that is effective for the polymer used. When the thermoplastic polymer is a polyester, the toughening agent will typically be an elastomer or has a relatively low melting point, generally <200° C., preferably <150° C. and that has attached to it functional groups that can react with the thermoplastic polyester (and optionally other polymers present). Since thermoplastic polyesters usually have carboxyl and hydroxyl groups present, these functional groups usually can react with carboxyl and/or hydroxyl groups. Examples of such functional groups include epoxy, carboxylic anhydride, hydroxyl (alcohol), carboxyl, and isocyanate. Preferred functional groups are epoxy, and carboxylic anhydride, and epoxy is especially preferred. Such functional groups are usually "attached" to the polymeric toughening agent by grafting small molecules onto an already existing polymer or by copolymerizing a monomer containing the desired functional group when the polymeric tougher molecules are made by copolymerization. As an example of grafting, maleic anhydride may be grafted onto a hydrocarbon rubber using free radical grafting techniques. The resulting grafted polymer has carboxylic anhydride and/or carboxyl groups attached to it. An example of a polymeric toughening agent wherein the functional groups are copolymerized into the polymer is a copolymer of ethylene and a (meth)acrylate monomer containing the appropriate functional group. By (meth)acrylate herein is meant the compound may be either an acrylate, a methacrylate, or a mixture of the two. Useful (meth)acrylate functional compounds include (meth)acrylic acid, 2-hydroxyethyl (meth)acrylate, glycidyl (meth)acrylate, and 2-isocyanatoethyl (meth)acrylate. In addition to ethylene and a functional (meth)acrylate monomer, other monomers may be copolymerized into such a polymer, such as vinyl acetate, unfunctionalized (meth)acrylate esters such as ethyl (meth)acrylate, n-butyl (meth)acrylate, and cyclohexyl (meth)acrylate. Preferred toughening agents include those listed in U.S. Pat. No. 4,753,980, which is hereby included by reference. Especially preferred toughening agents are copolymers of ethylene, ethyl acrylate or n-butyl acrylate, and glycidyl methacrylate.

It is preferred that the polymeric toughening agent used with thermoplastic polyesters contain about 0.5 to about 20 weight percent of monomers containing functional groups, preferably about 1.0 to about 15 weight percent, more preferably about 7 to about 13 weight percent of monomers containing functional groups. There may be more than one type of functional monomer present in the polymeric toughening agent. It has been found that toughness of the composition is increased by increasing the amount of polymeric toughening agent and/or the amount of functional groups. However, these amounts should preferably not be increased to the point that the composition may crosslink, especially before the final part shape is attained.

The polymeric toughening agent used with thermoplastic polyesters may also be thermoplastic acrylic polymers that are not copolymers of ethylene. The thermoplastic acrylic polymers are made by polymerizing acrylic acid, acrylate esters (such as methyl acrylate, n-propyl acrylate, isopropyl acrylate, n-butyl acrylate, n-hexyl acrylate, and n-octyl acrylate), methacrylic acid, and methacrylate esters (such as methyl methacrylate, n-propyl methacrylate, isopropyl methacrylate, n-butyl methacrylate (BA), isobutyl methacrylate, n-amyl methacrylate, n-octyl methacrylate, glycidyl methacrylate (GMA) and the like). Copolymers derived from two or more of the forgoing types of monomers may also be used, as well as copolymers made by polymerizing one or more of the forgoing types of monomers with styrene, acrylonitrile, butadiene, isoprene, and the like. Part or all of the components in these copolymers should preferably have a glass transition temperature of not higher than 0° C. Preferred monomers for the preparation of a thermoplastic acrylic polymer toughening agent are methyl acrylate, n-propyl acrylate, isopropyl acrylate, n-butyl acrylate, n-hexyl acrylate, and n-octyl acrylate.

It is preferred that a thermoplastic acrylic polymer toughening agent have a core-shell structure. The core-shell structure is one in which the core portion preferably has a glass transition temperature of 0° C. or less, while the shell portion is preferably has a glass transition temperature higher than that of the core portion. The core portion may be grafted with silicone. The shell section may be grafted with a low surface energy substrate such as silicone, fluorine, and the like. An acrylic polymer with a core-shell structure that has low surface energy substrates grafted to the surface will aggregate with itself during or after mixing with the thermoplastic polyester and other components of the composition of the invention and can be easily uniformly dispersed in the composition.

Suitable toughening agents for polyamides are described in U.S. Pat. No. 4,174,358. Preferred toughening agents include polyolefins modified with a compatibilizing agent such as an acid anhydride, dicarboxylic acid or derivative thereof, carboxylic acid or derivative thereof, and/or an epoxy group. The compatibilizing agent may be introduced by grafting an unsaturated acid anhydride, dicarboxylic acid or derivative thereof, carboxylic acid or derivative thereof, and/or an epoxy group to a polyolefin. The compatibilizing agent may also be introduced while the polyolefin is being made by copolymerizing with monomers containing an unsaturated acid anhydride, dicarboxylic acid or derivative thereof, carboxylic acid or derivative thereof, and/or an epoxy group. The compatibilizing agent preferably contains from 3 to 20 carbon atoms. Examples of typical compounds that may be grafted to (or used as comonomers to make) a polyolefin are acrylic acid, methacrylic acid, maleic acid, fumaric acid, itaconic acid, crotonic acid, citraconic acid, maleic anhydride, itaconic anhydride, crotonic anhydride and citraconic anhydride.

Preferred toughening agents for polyacetals include thermoplastic polyurethanes, polyester polyether elastomers, other functionalized and/or grafted rubber, and polyolefins that contain polar groups that are either grafted to their backbones or were incorporated by copolymerizing with a monomer that contained one or more polar groups. Preferable comonomers are those that contain epoxide groups, such as glycidyl methacrylate. A preferred toughening agent is EBAGMA (a terpolymer derived from ethylene, butyl acrylate, and glycidyl methacrylate).

When used the optional polymeric toughening agent will preferably be present in about 0.5 to about 15 weight percent, or more preferably in about 2 to about 10 weight percent, based on the total weight of the composition.

The compositions of this invention may optionally include one or more plasticizers, nucleating agents, flame retardants, flame retardant synergists, heat stabilizers, antioxidants, dyes, pigments, mold release agents, lubricants, UV stabilizers, (paint) adhesion promoters, fillers having aspect ratio of at most 5 other than the magnesium oxide (b) and the like.

The compositions of the present invention are preferably in the form of a melt-mixed or a solution-mixed blend, more preferably melt-mixed, wherein all of the polymeric components are well-dispersed within each other and all of the non-polymeric ingredients are homogeneously dispersed in and bound by the polymer matrix, such that the blend forms a unified whole. The blend may be obtained by combining the component materials using any melt-mixing method or by mixing components other than matrix polymer with monomers of the polymer matrix and then polymerizing the monomers. The component materials may be mixed to homogeneity using a melt-mixer such as a single or twin-screw extruder, blender, kneader, Banbury mixer, etc. to give a resin composition. Part of the materials may be mixed in a melt-mixer, and the rest of the materials may then be added and further melt-mixed until homogeneous. The sequence of mixing in the manufacture of the thermally conductive polymer resin composition of this invention may be such that individual components may be melted in one shot, or the filler and/or other components may be fed from a side feeder, and the like, as will be understood by those skilled in the art.

The composition of the present invention may be formed into articles using methods known to those skilled in the art, such as, for example, injection molding, blow molding, extrusion, press molding. The present compositions are especially useful in electrical and/or electronic devices, sometimes forming in a sense metal/resin hybrids. Such articles can include those for use in motor housings, lamp housings, lamp housings in automobiles and other vehicles, electrical and electronic housings, insulation bobbin which exist between coiled wire and magnetic inducible metal core in stator of motors or generators, and housings which substantially encapsulates the stator core of motors or generators. Examples of lamp housings in automobiles and other vehicles are front and rear lights, including headlights, tail lights, and brake lights, particularly those that use light-emitting diode (LED) lamps. Examples of application in electric devices are reflector and frame of LED lights. The articles may serve as replacements for articles made from aluminum or other metals in many applications.

EXAMPLES

Compounding and Molding Methods

The polymeric compositions shown in Table 1 were prepared by compounding in a 32 mm Werner and Pfleiderer twin screw extruder. All ingredients were blended together and added to the rear of the extruder except that the magnesium oxide and the fillers were side-fed into a downstream barrel. Barrel temperatures were set at about 320° C. for HTN and 315° C. for PPS.

The compositions were molded into ISO test specimens on an injection molding machine for the measurement of mechanical properties before and after PCT (Pressure Cooker Test), and into plates of 1 mm×16 mm×16 mm size for measurements of thermal conductivity and CLTE. Melt temperature were about 325° C. and mold temperatures were about 150° C.

For evaluating heat shock resistance, the compositions were overmolded with 1 mm thickness on the SUS304 (stainless steel) blocks of 48 mm×29 mm×8 mm size. Melt temperature were about 325° C. and mold temperatures and temperature of the SUS blocks inserted in the mold were about 150° C.

Testing Methods

Tensile strength and elongation were measured using the ISO 527-1/2 standard method. Flexural strength and modulus were measured using the ISO178-1/2 standard method. Notched charpy impact was measured using the ISO 179/1eA standard method. The above tests were conducted at 23° C.

PCT was conducted under 121° C., 0.2 MPa for 100 hours.

CLTE in mold flow direction were determined on about center portion of the plate in the temperature range from −40 to 150° C. using ASTM D696 method.

Thermal conductivity was determined on the plate using Laser Flash Method as described in ASTM E1461. Results are shown in Table 1.

Heat shock resistance was evaluated by heat cycles between −40° C. and 150° C. for 1 hour at each temperature with a thermal shock chamber TSA-101S, and measured number of cycles till crack is generated on the compositions overmolded on the SUS blocks. The compositions which did not crack through 300 cycles were judged as good, and those which cracked by 300 cycles were judged as NG (for "not good").

The following terms are used in Table 1:

HTN refers to Zytel® HTN501, a polyamide6TDT manufactured by E.I. du Pont de Nemours and Co., Wilmington, Del.

PPS refers to Ryton® QA280N, a polyarylene sulfide manufactured by Chevron Phillips Chemical Company LP LCP refers to Zenite® 6000, a liquid crystalline polymer manufactured by E.I. DuPont de Nemours and Co., Wilmington, Del.

2,6-NDA refers to 2,6-napthalene dicarboxylic acid, available from BP Amoco Chemical Company.

Talc refers to talc KOSSAP® #10 that is surface modified with an amino-silane coupling agent manufactured by Nippon Talc Co., Ltd.

PED521 refers to Licowax PED521 supplied from Clariant Japan. K.K.

CS-8CP is a calcium montanate supplied from Nitto Chemical Industry Co., ltd

Rubber-1 refers to Staphyloid® IM-203, a core-shell type polymer toughening agent, supplied from Ganz Chemical Co., Ltd.

Rubber-2 refers to Elvaloy® EP4934, an ethylene/vinyl-acrylate/glycidyl methacrylate terpolymer manufactured by E.I. DuPont de Nemours and Co., Wilmington, Del.

Ultranox 626A® is bis(2,4-di-tert-butylphenyl pentaerythritol) diphosphite, supplied from Chemtura Corporation.

AO-80 refers to ADKSTAB AO-80, a hindered phenol based antioxidant, supplied from ADEKA Corporation.

MgO-1 refers to RF98, a magnesium oxide manufactured by Ube Material Industries, Ltd. The weight gain of the RF98 powder by conditioning at 90° C., 90% RH for 100 hours was 0.3%, and its BET surface area was 0.09 square meters per gram.

MgO-1m refers to a RF98 processed with 1 weight % epoxy silane coupling agent, Z-6040 manufactured by Dow Corning Toray.

MgO-2 refers to RF98HR, a magnesium oxide manufactured by Ube Material Industries, Ltd. The weight gain of the RF98HR powder by conditioning at 90° C., 90% RH for 100 hours was 0.1%, and its BET surface area was 3.1 square meters per gram.

MgO-2m refers to a RF98HR processed with 1 weight % amino silane coupiing agent, Z-6011 manufactured by Dow Corning Toray.

MgO-3 refers to Coolfiller® CF2-100A manufactured by Tateho Chemical Industries Co., Ltd. The weight gain of the CF2-100A was 1.3%. An average size of the CF2-100A is about 25 μm.

GF-1 refers to FT756D, glass fibers manufactured by Owens Corning Japan Ltd. Tokyo, Japan. Diameter of the FT756D is 10 μm GF-2 refers to ECS03T-747H, glass fibers manufactured by Nippon Electric Glass Co., Ltd. Owens Corning Japan Ltd.

GF-3 refers to Vetrotex® 910EC10, glass fiber supplied by OCV Co.

f-SiO2 refers to FB940, a spherical fused silica manufactured by Denki Kagaku Kogyo K.K. Aspect ratio of the FB940 is almost 1.

TABLE 1

|  | Ex. 1 | Ex. 2 | Ex. 3 | Comp. Ex. 1 |
|---|---|---|---|---|
| HTN | 21.5 | 21.5 | 21.5 | 21.5 |
| 2,6-NDA | 0.4 | 0.4 | 0.4 | 0.4 |
| Talc | 1.0 | 1.0 | 1.0 | 1.0 |
| PED521 | 0.1 | 0.1 | 0.1 | 0.1 |
| Rubber-1 | 4.0 | 4.0 | 4.0 | 4.0 |
| Ultranox 626A | 0.1 | 0.1 | 0.1 | 0.1 |
| AO-80 | 0.3 | 0.3 | 0.3 | 0.3 |
| CS-8CP | 0.1 | 0.1 | 0.1 | 0.1 |
| MgO-1 | 37.7 |  |  |  |
| MgO-2 |  | 37.7 |  | 37.7 |
| MgO-2m |  |  | 37.7 |  |
| MgO-3 |  |  |  |  |
| GF-1 | 34.8 | 34.8 | 34.8 |  |
| f-SiO2 |  |  |  | 34.8 |
| Thermal conductivity (W/m° K) | 0.7 | 0.7 | 0.7 | 0.90 |
| CLTE (ppm/° C.) | 17 | 16 | 16 | 25 |
| Heat shock resistance | Good | Good | Good | NG |
| Tensile strength (MPa) | 81 | 97 | 110 | 56 |
| Tensile strength after PCT (MPa) | 55 | 12 | 40 | 0 |
| Retention after PCT (%) | 68 | 12 | 36 | 0 |
| Tensile elongation (%) | 1.0 | 1.1 | 1.2 | 0.9 |
| Flexural Modulus (GPa) | 15.3 | 15.9 | 15.7 | 9.9 |
| N-Charpy Impact (kJ/m2) | 2.9 | 3.2 | 3.3 | 2.0 |

All ingredient quantities are given in weight percent relative to the total weight of the composition.

TABLE 2

|  | Ex. 4 | Ex. 5 | Comp. Ex. 2 | Comp. Ex. 3 |
|---|---|---|---|---|
| PPS | 29.0 | 29.0 | 29.0 | 29.0 |
| Rubber-2 | 2.0 | 2.0 | 2.0 | 2.0 |
| MgO-1 | 36.0 |  |  | 36.0 |
| MgO-1m |  | 36.0 |  |  |
| MgO-3 |  |  | 36.0 |  |
| GF-1 | 33.0 | 33.0 | 33.0 |  |
| f-SiO2 |  |  |  | 33.0 |
| Thermal conductivity (W/m° K) | 0.6 | 0.5 | 0.4 | 0.8 |
| CLTE (ppm/° C.) | 21 | 20 | 18 | 34 |
| Heat shock resistance | Good | Good | Good | Ng |
| Tensile strength (MPa) | 87 | 96 | 105 | 58 |
| Tensile strength after PCT (MPa) | 37 | 54 | 28 | 19 |
| Retention after PCT (%) | 42 | 56 | 27 | 32 |
| Tensile elongation (%) | 0.9 | 1.1 | 1.0 | 0.8 |
| Flexural Modulus (GPa) | 16.8 | 17.0 | 17.6 | 11.5 |
| N-Charpy Impact (kJ/m2) | 3.1 | 3.1 | 3.8 | 1.9 |

All ingredient quantities are given in weight percent relative to the total weight of the composition.

What is claimed is:

1. A thermally conductive polymer composition, comprising:
   (a) about 15 to about 70 weight percent of thermoplastic polymer;
   (b) about 20 to about 60 weight percent of magnesium oxide;
   (c) about 5 to about 50 weight percent of filler having an aspect ratio greater than 5; wherein one or more of said (c) fillers are used, selected from the group consisting of glass fibers, wollastonites, glass flakes, talc, mica, and titanium oxide fiber; and
   (d) about 0.05 to about 15 weight percent of at least one polymeric toughening agent;
   wherein said (b) magnesium oxide has a weight gain by conditioning at 90° C., 90% RH for 100 hours of less than 0.8%; and, wherein said polymer composition has a thermal conductivity of at least 0.5 W/mK, the percentages being based on the total weight of the composition.

2. The composition of claim 1 wherein one or more of said (c) fillers is glass fibers.

3. The composition as recited in claim 1 wherein said (b) magnesium oxide is coated with a coupling agent, wherein the coupling agent is a silane, titanate, zirconate, aluminate, or zircoaluminate.

4. The composition as recited in claim 3, wherein said coupling agent is present in an amount ranging from 0.5 to 5 weight percent based on the weight of said (b) magnesium oxide.

5. The composition as recited in claim 1 wherein said (b) magnesium oxide has a BET surface area of less than 3 square meters per gram.

6. The composition as recited in claim 1 wherein one or more of said (a) thermoplastic polymers are used, selected from the group consisting of thermoplastic polyester, thermoplastic polyamide, liquid crystalline polymer and polyarylene sulfide.

7. An article made from the composition of claim 1.

8. A metal/polymer hybrid article made with the composition of claim 1.

9. An insulator of a stator core of motors or generators made of the composition of claim 1.

10. A stator assembly encapsulated with the composition of claim 1.

* * * * *